United States Patent
Shiraishi

(10) Patent No.: US 7,280,951 B2
(45) Date of Patent: Oct. 9, 2007

(54) METHOD OF MAKING FINITE ELEMENT MODEL OF TIRE HAVING FINE GROOVE

(75) Inventor: Masaki Shiraishi, Kobe (JP)

(73) Assignee: Sumitomo Rubber Industries, Ltd., Kobe (JP)

( * ) Notice: Subject to any disclaimer, the term of this patent is extended or adjusted under 35 U.S.C. 154(b) by 800 days.

(21) Appl. No.: 10/108,720

(22) Filed: Mar. 29, 2002

(65) Prior Publication Data

US 2002/0139469 A1   Oct. 3, 2002

(51) Int. Cl.
*G06G 7/48* (2006.01)
(52) U.S. Cl. ............... 703/8; 703/6; 703/7; 152/209.1; 152/209.3; 152/209.18; 73/146
(58) Field of Classification Search ............. 703/6, 703/7, 8; 152/209.1, 209.3, 209.18; 73/146
See application file for complete search history.

(56) References Cited

U.S. PATENT DOCUMENTS

| | | | | |
|---|---|---|---|---|
| 5,710,718 | A * | 1/1998 | Kamegawa et al. ............ | 703/1 |
| 6,199,026 | B1 * | 3/2001 | Shiraishi et al. ............ | 702/140 |
| 6,456,289 | B1 * | 9/2002 | O'Brien et al. .............. | 345/473 |
| 6,691,566 | B2 * | 2/2004 | Iwasaki et al. ................ | 73/146 |
| 6,725,168 | B2 * | 4/2004 | Shiraishi et al. ............... | 702/81 |
| 6,761,060 | B2 * | 7/2004 | Mancosu et al. ............. | 73/146 |
| 6,868,716 | B2 * | 3/2005 | Okano et al. .................. | 73/146 |

FOREIGN PATENT DOCUMENTS

EP    1 030 170 A    8/2000

OTHER PUBLICATIONS

Piegl et al., Computers and Graphics, vol. 17, No. 5 (1993) pp. 563-574.

* cited by examiner

*Primary Examiner*—Kamini Shah
*Assistant Examiner*—Herng-der Day
(74) *Attorney, Agent, or Firm*—Birch, Stewart, Kolasch & Birch, LLP

(57) ABSTRACT

A method of making a finite element model of a tire is disclosed. The tire is provided in a tread portion with a fine groove having a dead end including at least the bottom. The tread portion is divided into elements so that the elements include first elements on one side of the fine groove and second elements on the other side of the fine groove, and the first elements and second elements have nodes in common at the dead end, but the first elements and second elements do not have nodes in common at other positions than the dead end.

4 Claims, 12 Drawing Sheets

METHOD OF MAKING FINITE ELEMENT MODEL OF TIRE HAVING FINE GROOVE

The present invention relates to a method of making a model of a tire for a finite element method, more particularly to handling of a fine groove such as a sipe provided in the tread portion by which precision simulation of the rolling tire is possible without increasing the scale of computing data and the computation time.

In recent years, a finite element method is used in designing a pneumatic tire to simulate the tire which is running under various conditions to estimate characteristics and performance of the tire.

In the pneumatic tires, on the other hand, the tread components such as tread blocks, ribs and the like which constitute the tread are often provided with so called sipes, that is, a fine groove having a width of about 1.0 mm or less. As is often the case with a winter tire having a block pattern tread, the number of such sipes reaches up to five or more per a block. Accordingly, the total number of the sipes over the tire becomes a very large number.

If such a siped tread rubber is modeled into a finite element model (b) by the orthodox way, in other words if the details are geometrically reproduced as exactly as possible, as shown in FIG. 20, a very small element (c) having a width equal to the sipe width w is formed under the sipe (a). As the adjacent elements (d) are relatively large—the width is usually at least 5 mm or 6 mm, if a load is applied to the block during rolling simulation, the block is deformed and the small element is crushed differently from the actual tire case. The crushing may be avoided if the size of the adjacent elements are decreased. In this case, however, as the number of the elements is excessively increased, it is difficult to shorten the computation time for simulating, and there is a possibility that the processing becomes impossible.

It is therefore, an object of the present invention to provide a method of making a finite element tire model by which computation time and model making time can be shortened without lowering the precision of simulation even though the tire is provided in the tread portion with a large number of fine grooves.

According to the present invention, a method of making a finite element model is for a tire provided with a fine groove having a dead end including at least the bottom, and the method comprises dividing the tire into elements so that the elements include first elements on one side of the fine groove and second elements on the other side of the fine groove, and the first elements and second elements have nodes in common at the above-mentioned dead end.

An embodiment of the present invention will now be described in detail in conjunction with the accompanying drawings.

In this embodiment, the tire used is a pneumatic tire. But the present invention may be applicable to not only a non-pneumatic tire but also a load supporting inner structure of a safety tire and the like.

The tire is provided in the tread portion with sipes 2 and relatively wide tread grooves to form a tread pattern such as block pattern, rib pattern, block-rib pattern, rug pattern, rib-rug pattern and the like. Here, the sipe 2 is a fine groove having a certain width w of not more than 2.0 mm, in this example less than 1.10 mm. Each sipe 2 can be formed as being (1) an open type (both ends are opened), (2) a closed type (both ends are closed) or (3) a semi-open type (one end is opened and the other end is closed). Hereinafter, the closed end and the bottom are called "dead end". The configuration of each sipe and the formation of the sipes are not specifically limited in the present invention.

The modeling of the tread rubber T, i.e. siped tread components is described below in detail. Other parts of the tire such as tread reinforcing belt, carcass, bead core, bead apex rubber, bead rubber, sidewall rubber, and the like are suitably modeled according to the materials, positions and the like of the parts and simulation purpose. For a more detailed description, please see U.S. Pat. No. 6,199,026, entitled "Method of and apparatus for simulating rolling tire", issued on Mar. 6, 2001, the disclosure of which is incorporated herein by reference.

Figure 1:
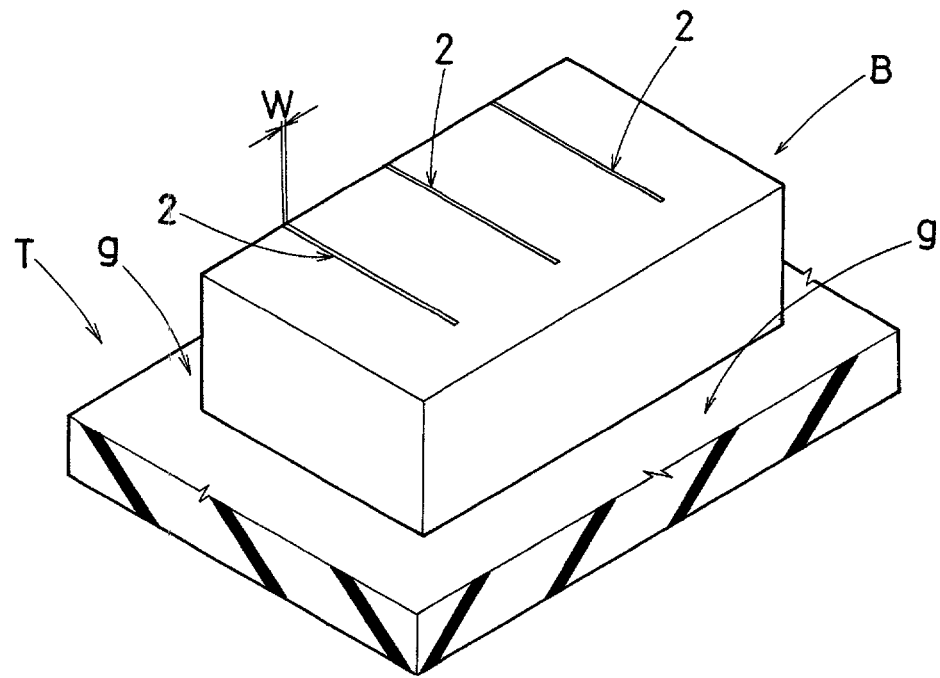
FIG. 1 is a perspective view of a part of a tread rubber in which sipes or fine grooves are disposed.

FIG. 1 shows an exemplary tread block (B) as a part of the tread rubber T on the tread reinforcing belt, wherein a plurality of sipes 2 are disposed.

Firstly, a temporary boundary face 3 is defined for each of the sipe 2.

In this embodiment, the temporary boundary face 3 means the center plane of the sipe 2, that is, a face extending along the center of the width w of the sipe 2. In other words, this process is to find the center plane of the sipe in the widthwise direction and define the coordinates thereof in the three-dimensional coordinate system used to determine the divided finite elements. It is however not always necessary that the temporary boundary face 3 is the center plane. It may be defined off the center by adjusting the distances in the under-mentioned copying and shifting of the nodes.

Figure 2:
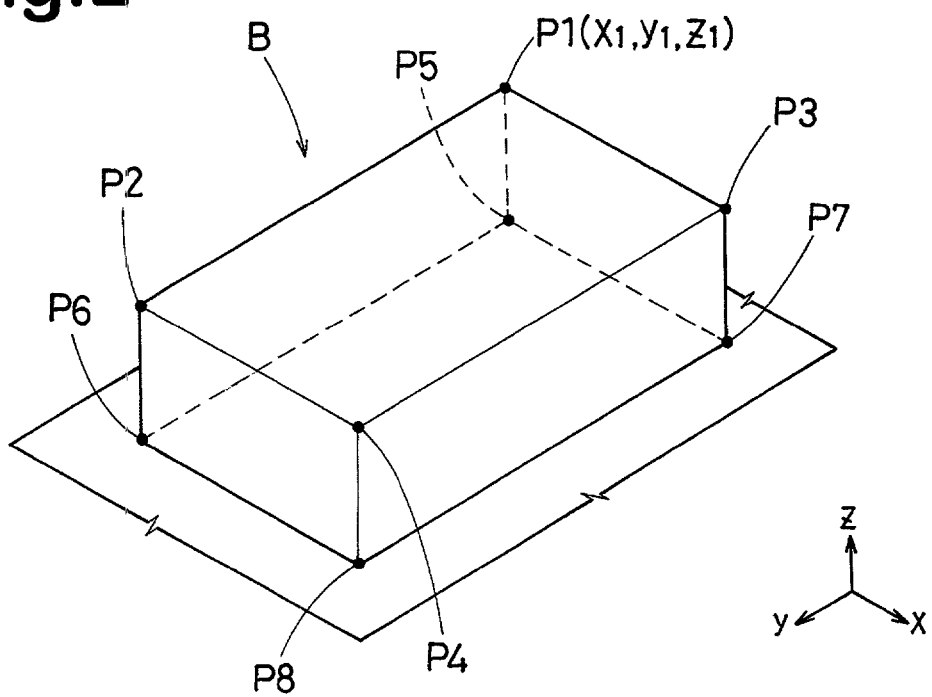
FIG. 2 is a visualization in a perspective manner, of data on coordinates of the same part.
Figure 3:
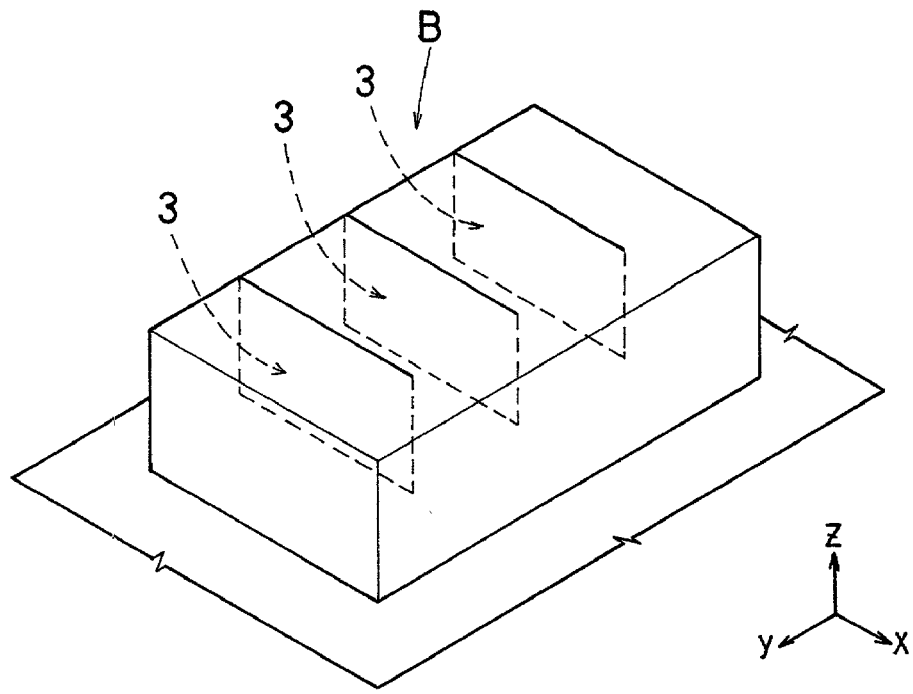
FIG. 3 is the same as FIG. 2 except that temporary boundary faces are also visualized therein.
Figure 4:
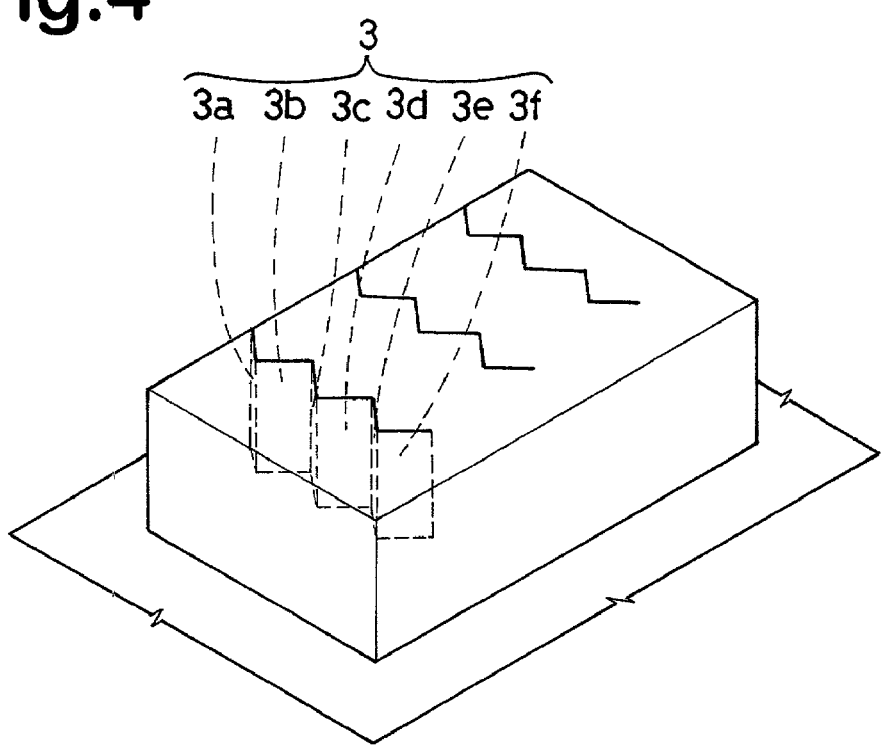
FIG. 4 is a similar visualization in which the sipes are zigzag.

FIG. 2 shows a part of a three-dimensional tread pattern corresponding to the part shown in FIG. 1 which is visualized in an isometric drawing. Here, the three-dimensional tread pattern means a set of data on coordinates P1, P2 - - - Pn of various points of the tread portion in the three-dimensional coordinate system (in this example X-Y-Z coordinate system) which data can specify the geometry of the tread portion. In FIG. 3, the temporary boundary faces 3 of the sipes 2 are visualized together with the tread block (B). When the sipe is flat as shown in FIG. 1, the temporary boundary face 3 is a single flat face as shown in FIG. 3. In case of zigzag sipe, as shown in FIG. 4, the temporary boundary face 3 is made up of a plurality of flat faces 3a-3f. If the sipe has a wavy configuration, the temporary boundary face 3 is made up of flat faces arranged zigzag to resemble the curved configuration.

Secondly, the tread rubber T is divided into a finite number of polyhedral solid elements E such as tetrahedral solid element, pentahedral solid element, hexahedral solid element and the like.

The dividing is such that each temporary boundary face 3 is made up of a plurality of element surfaces. The element surfaces are of the elements defined as being adjacent to the temporary boundary face 3. There is no element extending across the temporary boundary face 3, and some of the nodes of these element surfaces are positioned on the periphery of the temporary boundary face 3 and the rest are positioned on the inside thereof. For each of the divided elements E, a rigidity, material constants such as complex elastic modulus and loss tangent, hardness and the like of the tread rubber part which is represented by the element are defined.

Figure 5:
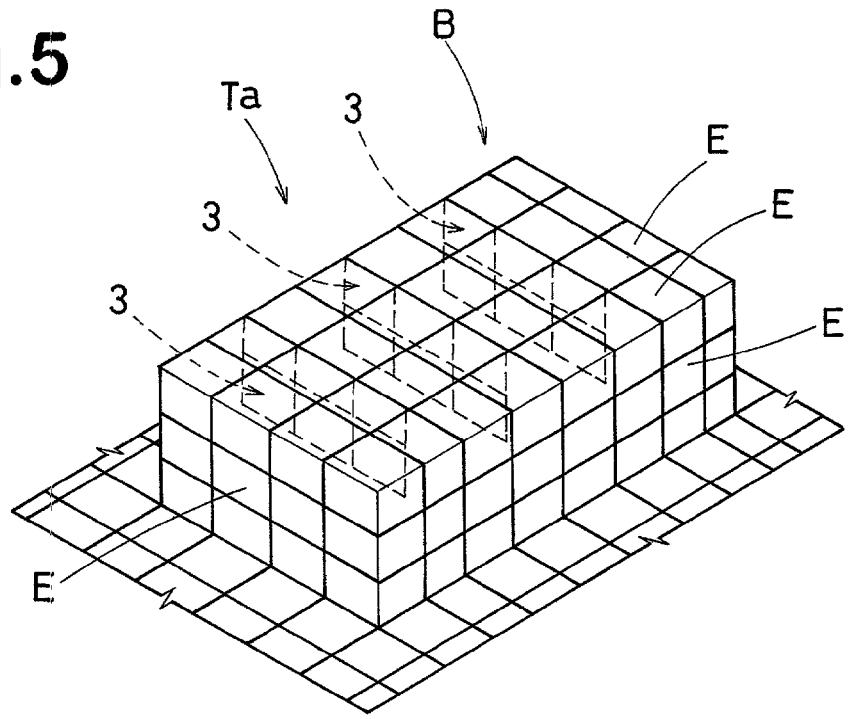
FIG. 5 is the visualization of FIG. 3 on which element dividing lines are also drawn.
Figure 9:
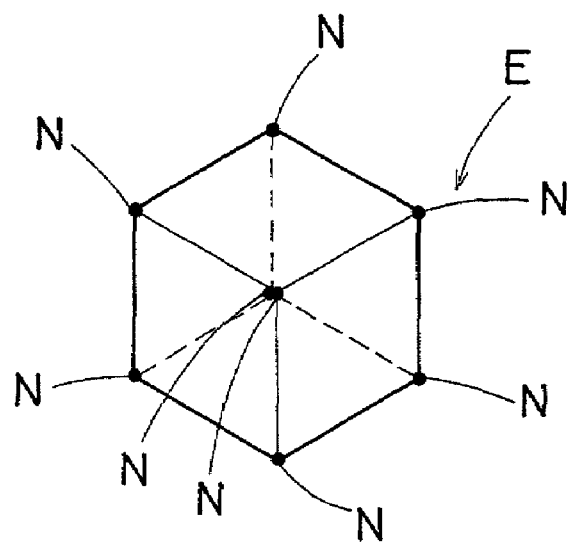
FIG. 9 is a diagram for explaining a hexahedral solid element.

FIG. 5 shows an example of the dividing of the same part as of FIG. 1, wherein the tread block (B) is divided into hexahedral solid elements. Incidentally, a hexahedral solid element E has, as shown in FIG. 9, six element surfaces and eight nodes N.

Figure 6:
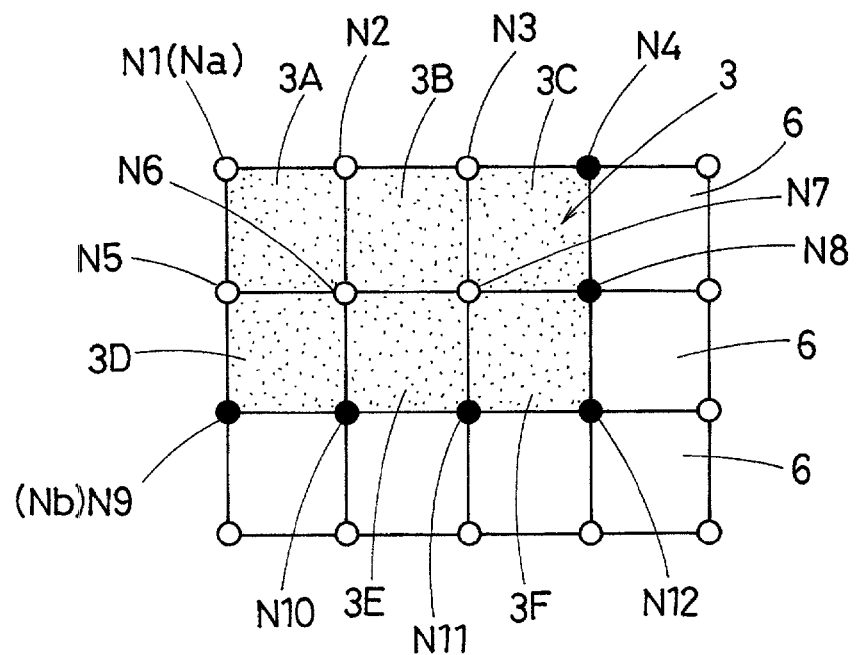
FIG. 6 is a diagram for explaining nodes of the temporary boundary face of a semi-open type sipe.

FIG. 6 shows a plane obtained by cutting along one of the temporary boundary faces 3 in FIG. 5. The temporary boundary face 3 is distinguished by dotting. As known from FIG. 6, in this example, a part on each side of a sipe 2 is divided into six hexahedral solid elements. Therefore, the temporary boundary face 3 is made up of six quadrilateral element surface 3A-3F and their twelve nodes N1 to N12 are associated with the temporary boundary face 3. AS to the shape of the element surface 3A-3F, quadrilaterals and/or triangles are preferably used. But, other polygons may be used too.

Figure 7:
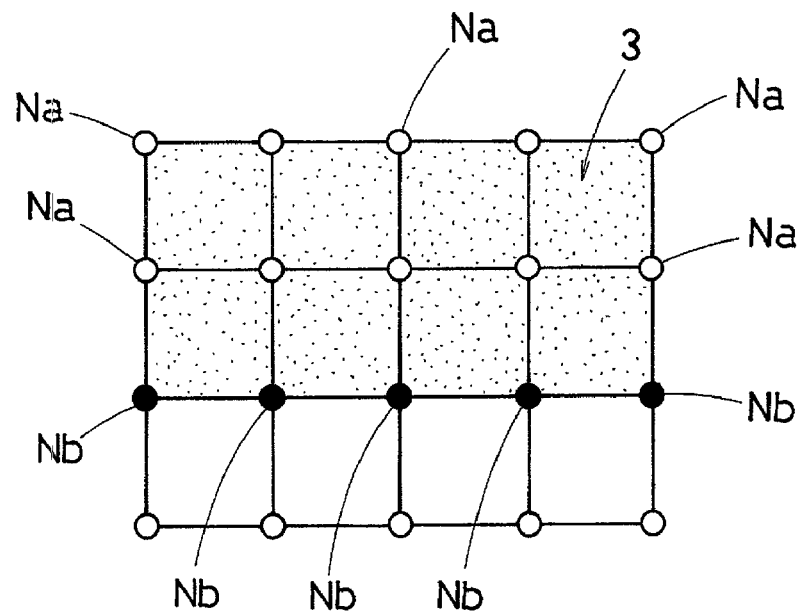
FIG. 7 is a diagram for explaining nodes of the temporary boundary face of an open type sipe.
Figure 8:
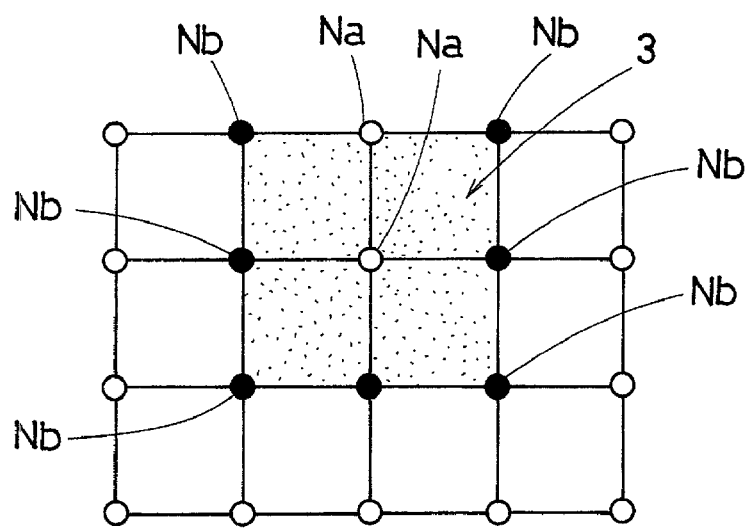
FIG. 8 is a diagram for explaining nodes of the temporary boundary face of a closed type sipe.

The nodes N (N1 to N12) associate with a temporary boundary face 3 include nodes Nb positioned at the "dead end" of the sipe (hereinafter, the "on-border node" Nb). The rest (hereinafter, the "off-border node Na") are positioned at other positions than the "dead end". As the example shown in FIG. 6 is the above-mentioned semi-open type sipe, the on-border nodes Nb which are positioned at the bottom and one closed end are N4, N8, N9, N10, N11 and N12. The off-border nodes Na are N1, N2, N3, N5, N6 and N7. In case of open type sipe, as shown in FIG. 7, the on-border nodes Nb are positioned at the bottom only. In case of closed type sipe, as shown in FIG. 8, the on-border nodes Nb are positioned at the bottom and both of the closed ends. In FIGS. 6, 7 and 8, the on-border nodes are indicated as a black dot. In other words, the coordinates of the nodes (N1 to N12) are so determined in dividing the tread rubber.

Figure 11:
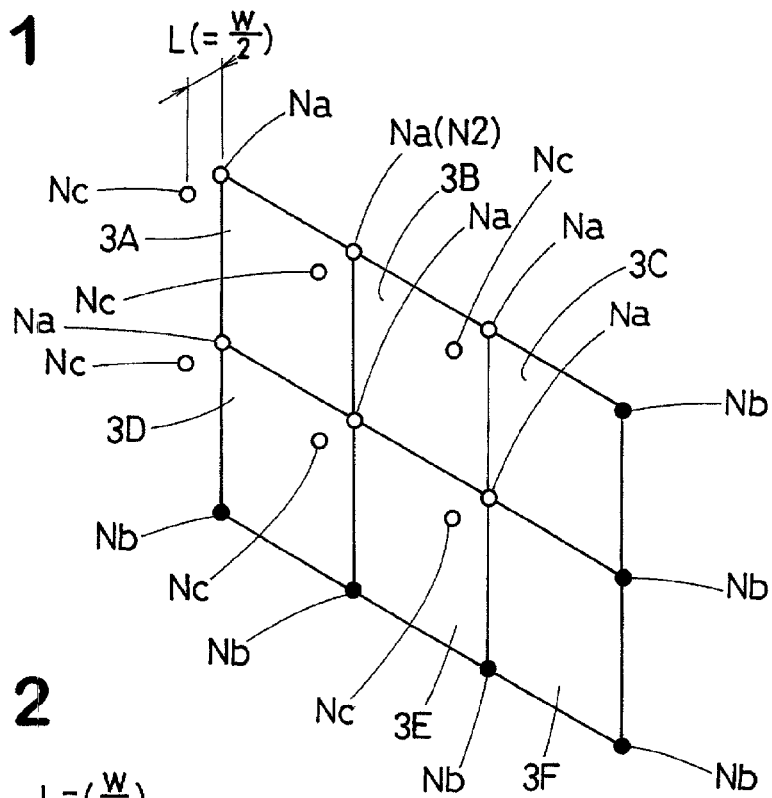
FIG. 11 is a diagram perspectively showing a temporary boundary face and copied nodes.

FIG. 11 is a visualization of the temporary boundary face 3 of FIG. 6 in a perspective manner.

Thirdly, as shown in FIG. 11, each off-border node Na is copied to make a copied node NC at a position at a small distance L from the original position whereas the on-border nodes Nb are not copied and their positions are not shifted.

In this example, the above-mentioned small distance L is one half of the width W of the sipe 2 because the temporary boundary face 3 is the center plane.

With respect to each temporary boundary face 3, all the copied positions are on the same side of the temporary boundary face 3. The direction from the original position to the copied position (hereinafter the "copy direction") is a direction of vector sum of normal vectors of the element surfaces which have the off-border node in common. For instance, in case of the off-border node N2, the copy direction is determined from the normal vectors of the element surfaces 3A and 3B.

Figure 10:
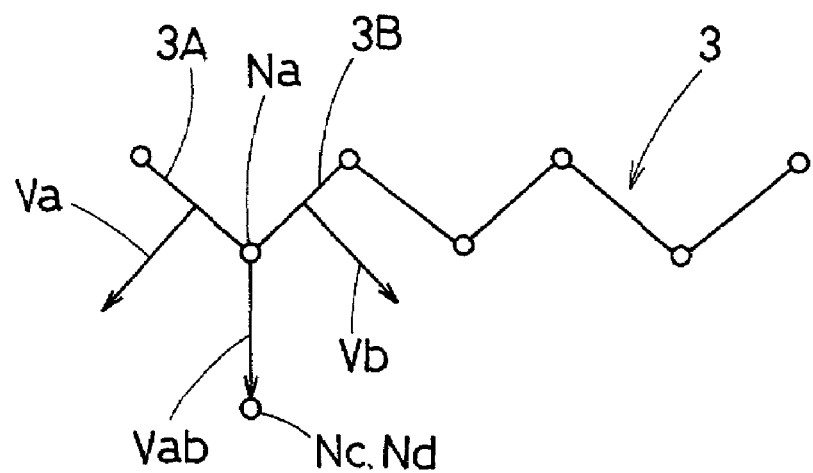
FIG. 10 is a diagram for explaining the direction to copy or shift a node.

Accordingly, when the element surfaces are substantially in a flat plane, the copy direction is normal to the flat plane. In case of zigzag sipe, as the temporary boundary face 3 is also zigzag as shown in FIG. 10, normal vectors va and vb of element surfaces 3A and 3B which have an off-border node Na in common have different directions. By using the direction of the vector sum of the normal vectors va and vb, the copy direction can be given as only one direction.

Figure 12:
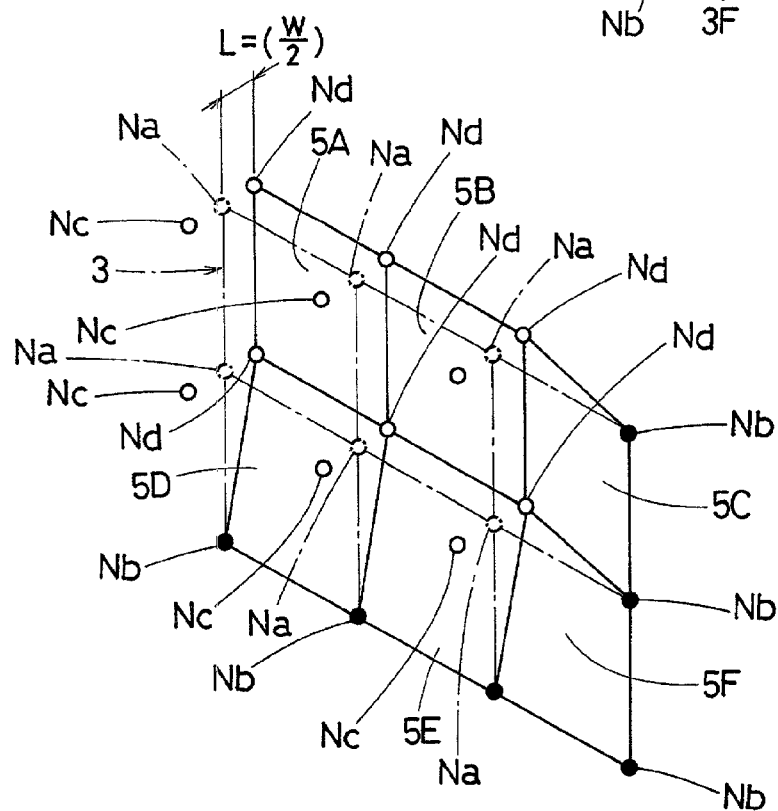
FIG. 12 is a diagram perspectively showing the temporary boundary face and shifted nodes.

Fourthly, the above-mentioned off-border node Na is shifted by the small distance L (w/2 in this example) on the other side of the temporary boundary face 3 than the copied node NC as shown in FIG. 12. (hereinafter the "shifted node Nd") The direction from the original position to the shift position is determined in the same way as the above-mentioned copy direction, using vectors.

Figure 13:
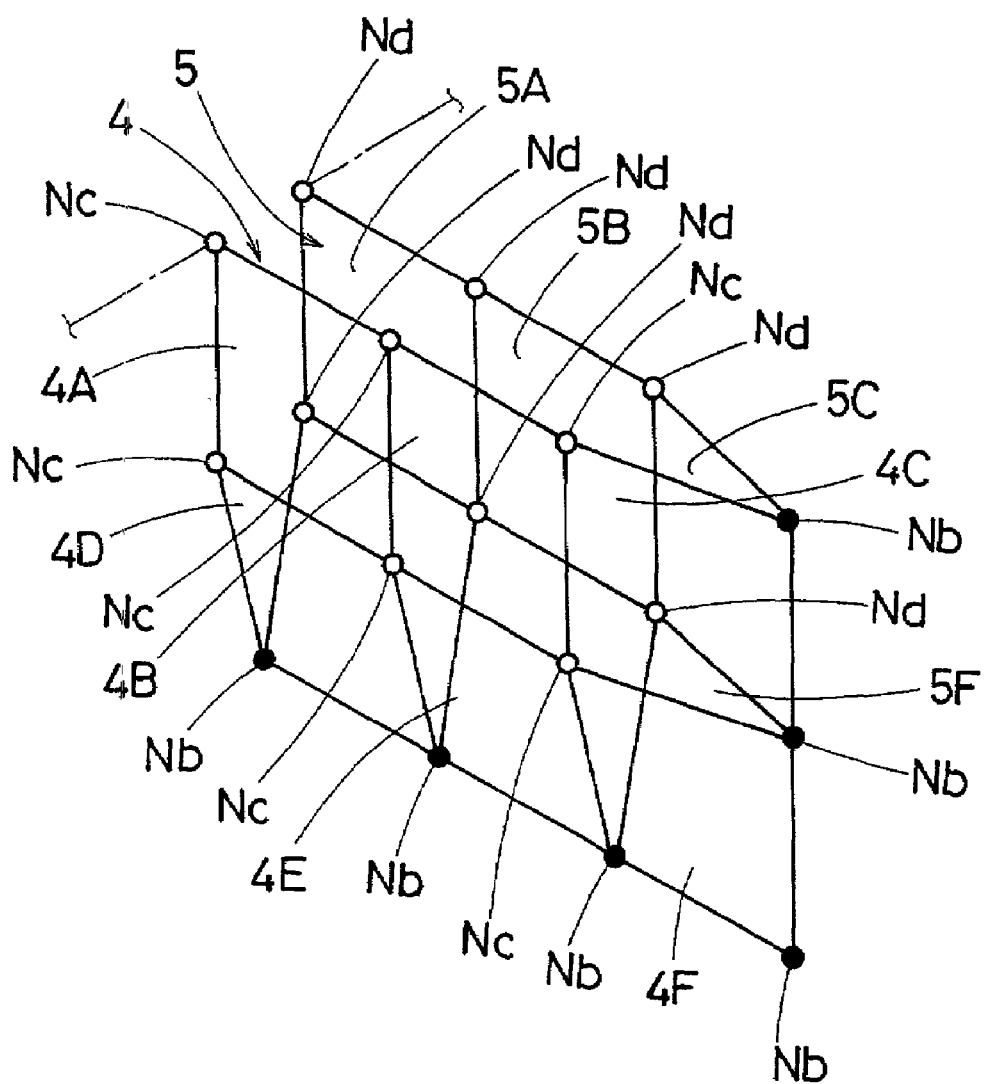
FIG. 13 is a diagram perspectively showing wall surfaces of the sipe.

Therefore, as shown in FIG. 13, the copied nodes NC, shifted nodes Nd and the on-border nodes Nb staying in the original positions are defined for each sipe 2.

Fifthly, using these nodes NC, Nd and Nb, a pair of wall surfaces 4 and 5 are defined for each of the sipes 2. The wall surface 4 is defined by the copied nodes Nc and the on-border nodes Nb. The wall surface 5 is defined by the shifted nodes Nd and the on-border nodes Nb.

Figure 14:
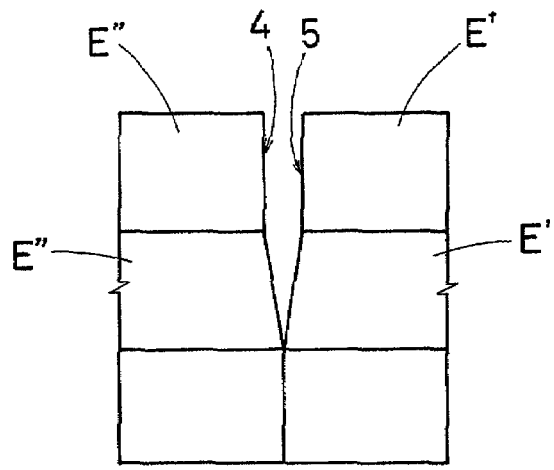
FIG. 14 shows a cross section of the wall surfaces of the sipe.

In this example, as shown in FIG. 13 and FIG. 14, the wall surface 4 consists of six element surfaces 4A, 4B, 4C, 4D, 4E and 4F which are of the elements E" remade to have the copied nodes NC and the on-border nodes Nb. The wall surface 5 consists of six element surface 5A, 5B, 5C, 5D, 5E and 5F which are of the elements E' remade to have the shifted node Nd and the on-border nodes Nb.

The hexahedral solid elements on both sides of the temporary boundary face 3 which originally have the off-border nodes Na and on-border nodes Nb are remade such that the hexahedral solid element E" on the wall surface 4 side have the copied nodes NC and the on-border nodes Nb, and the hexahedral solid element E' on the wall surface 5 side have the shifted node Nd and the on-border nodes Nb. Thus, the original elements are converted as explained above, and the finite element model of the tread block is made.

Figure 15:
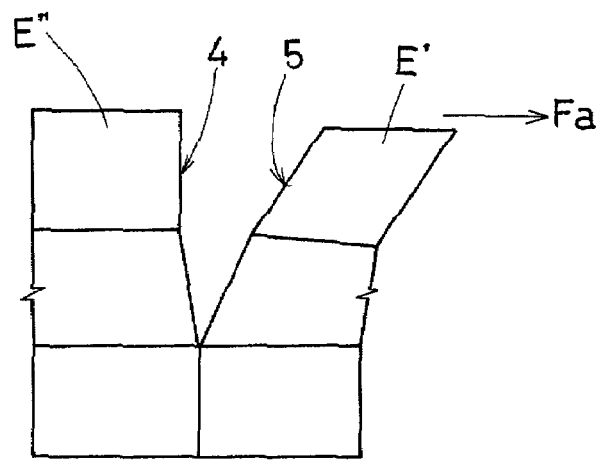
FIGS. 15 and 16 are the cross sections showing opening and closing of the wall surfaces.
Figure 16:
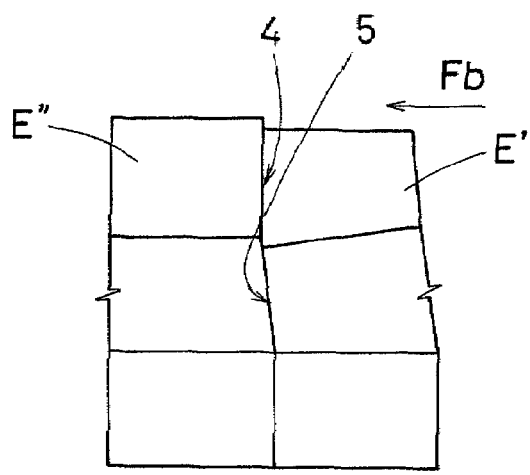

In a finite element method, for each tread block model, conditions for contact and separation between the wall surfaces 4 and 5 are set such that the space between the wall surfaces 4 and can be increased by an outwards force Fa as shown in FIG. 15 and the wall surfaces 4 and 5 can contact with each other by an inwards force Fb as shown in FIG. 16.

The above description was made based on a simplified example such that the block is cubic and divided into hexahedral elements of almost same size for convenience's sake.

Figure 17:
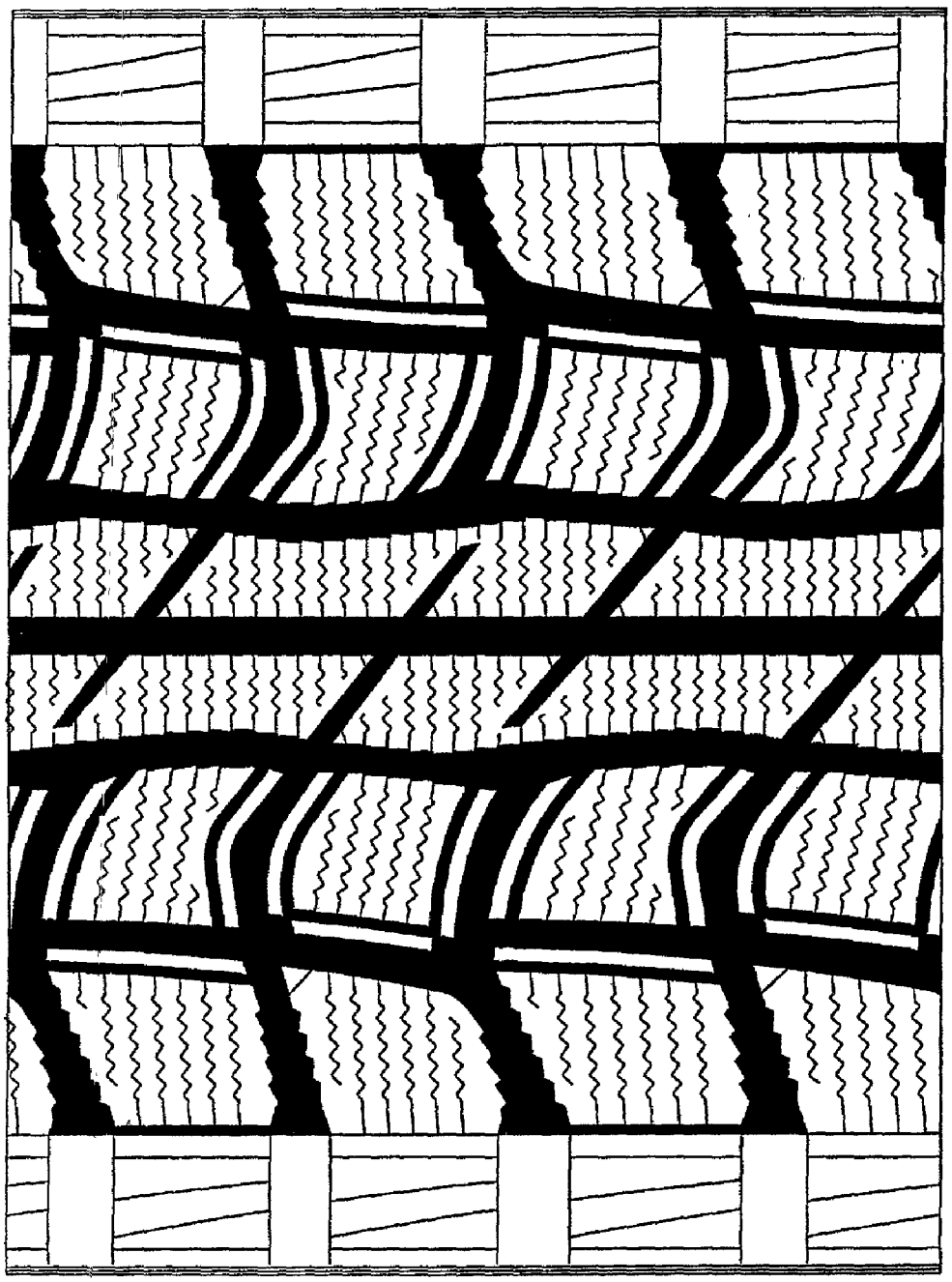
FIG. 17 shows a practical example of the tread pattern of a tire.
Figure 18:
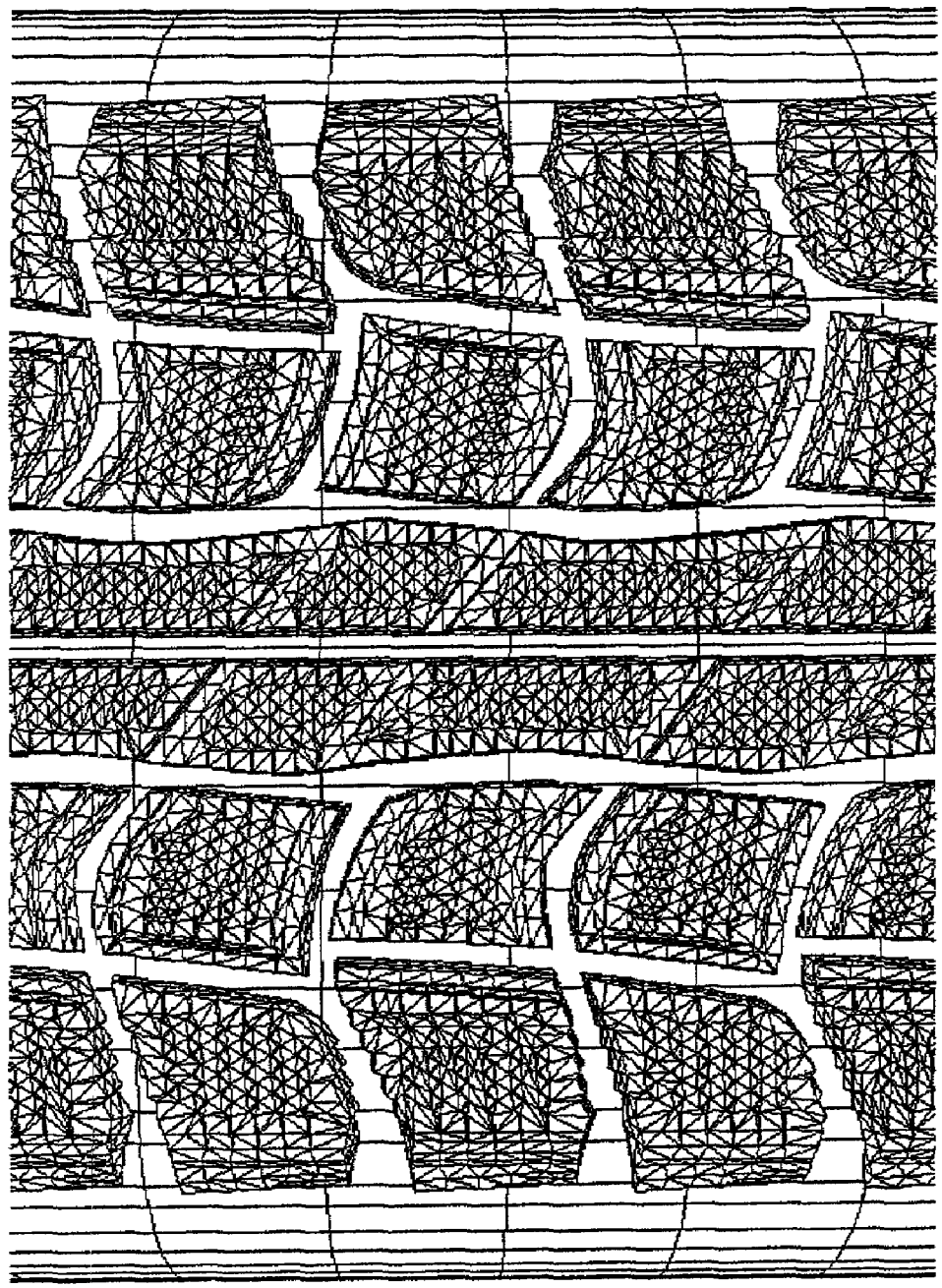
FIG. 18 shows a tread part of a finite element model of the tire.
Figure 19:
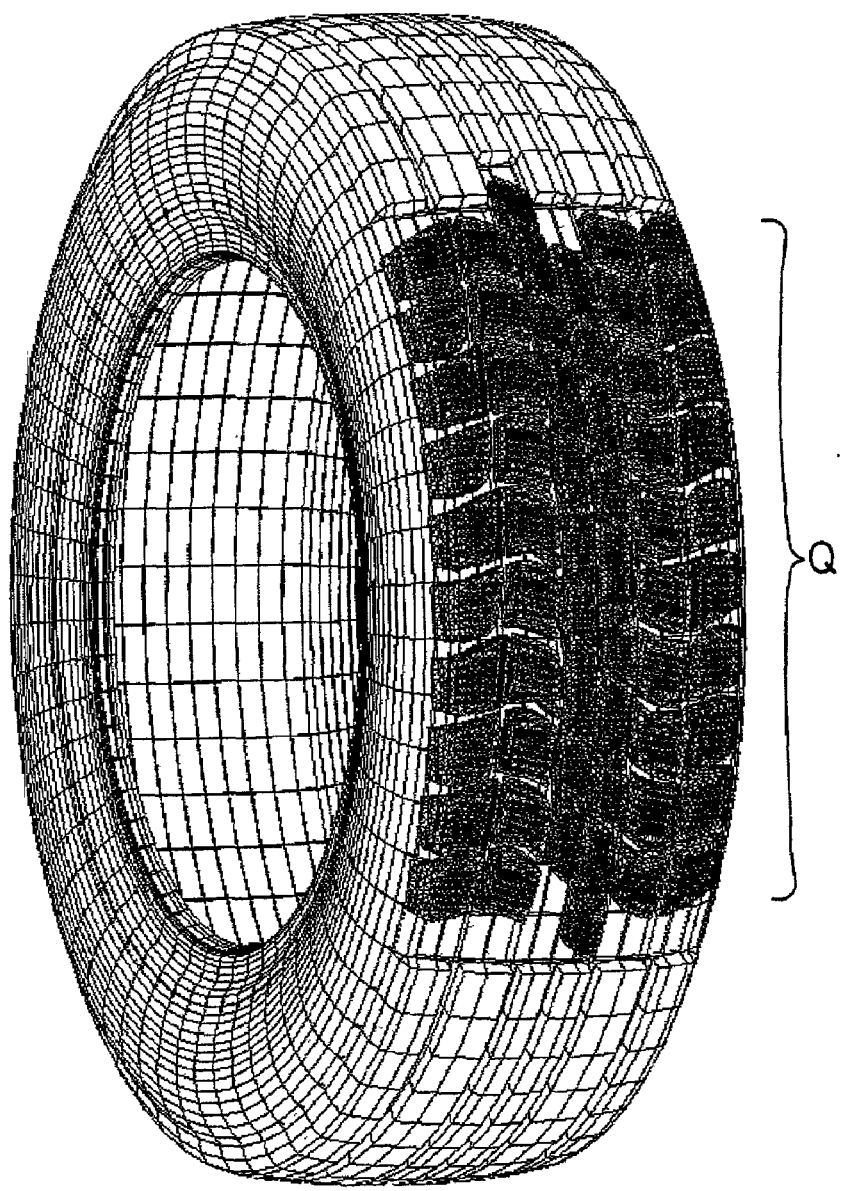
FIG. 19 shows a finite element tire model in a state that a tire body model is partly combined with a tread model.
Figure 20:
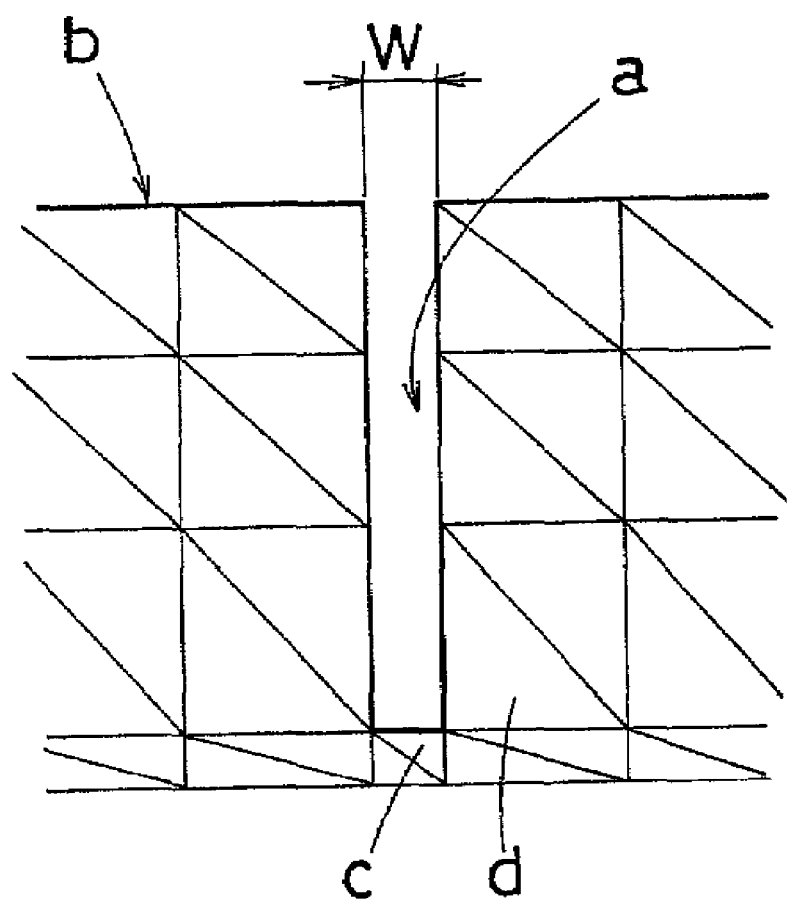
FIG. 20 is a diagram for explaining problems in the conventional method.

FIGS. 17-19 show a practical example.

FIG. 17 shows a practical tread pattern for a studless tire. In this block pattern, the tread blocks are each provided with several zigzag sipes including an open type and semi-open type. A finite element model of the tread rubber can be made as explained above. FIG. 18 shows such a tread model. On the other hand, a finite element model of a tire main body (part excluding the tread rubber) is separately made. Then, the tread model and tire main body model are combined. FIG. 19 shows a state that the tire main body model is partly combined with the tread model Q. When combined entirely, a finite element tire model is completed. For a more detailed description of the combination of the tread model and tire main body model, please see the disclosure of the above-mentioned U.S. Pat. No. 6,199,026.

The making of the tire model is of course executed on a computer system. By giving data on the temporary boundary face such as the position, size, type-open/semi-open/close, configuration-straight/zigzag, width and the like of the sipe, and data relating to the dividing such as division number, the computer automatically executes the following processes to make the tread model: determining the coordinates of the off-border node Na and on-border nodes Nb; determining the shift/copy directions; converting the above-mentioned determined coordinates into the coordinates of the copied nodes Nc and the coordinates of shifted node Nd; and remaking the elements using the converted coordinates so that elements on one side of a sipe have nodes in common with elements on the other side of the sipe at the dead end.

The invention claimed is:

1. A method of evaluating characteristics and performance of a tire comprising a tire main body and tread rubber provided with fine grooves each having a dead end including at least a bottom of the fine groove and confronting walls with a finite spacing between the walls at the dead end, the method comprising:

making a finite element model of the tread rubber including:

dividing said model into elements so that, for each fine groove, the elements include first elements on one side of the fine groove and second elements on the other side of the fine groove, wherein the first elements and second elements having on-border nodes in common at said dead end, but the first elements and second elements not having nodes in common at other positions than said dead end;

determining a temporary boundary face between the first elements and second elements of each fine groove;

defining nodes on each temporary boundary face, which nodes include off-border nodes and said on-border nodes;

duplicating said off border nodes of each fine groove so that doubled nodes are defined which doubled nodes are first nodes and second nodes spaced from the first nodes in the widthwise direction of each fine groove;

defining surfaces of the first elements by positions of (1) the first nodes or (2) the first nodes and the on-border nodes; and defining surfaces of the second elements by positions of (1) the second nodes or (2) the second nodes and the on-border nodes;

combining the finite element model of the tread rubber with a finite element model of the tire main body to make a finite element model of the tire;

simulating running of the finite element model of the tire; and evaluating characteristics and performance of the tire based on the response of the finite element model of the tire to the simulated running.

2. The method according to claim 1, wherein in the duplicating of the off-border nodes, the off border nodes on the temporary boundary face are copied to one side of the temporary boundary face, at a small distance therefrom, to define the first nodes, and the off border nodes are shifted to the other side of the temporary boundary face, at a small distance therefrom, to define the second nodes.

3. The method according to claim 2, wherein the temporary boundary face is a center plane of the fine groove.

4. The method according to claim 2, wherein the temporary boundary face is off the center of the width of the fine groove.

* * * * *